Jan. 10, 1967 J. P. GRIFFIN 3,296,692

THERMOCOMPRESSION WIRE ATTACHMENTS TO QUARTZ CRYSTALS

Filed Sept. 13, 1963 2 Sheets-Sheet 1

INVENTOR
J. P. GRIFFIN
BY
ATTORNEY

United States Patent Office 3,296,692

Patented Jan. 10, 1967

3,296,692

THERMOCOMPRESSION WIRE ATTACHMENTS TO QUARTZ CRYSTALS

Jack P. Griffin, Short Hills, N.J., assignor to Bell Telephone Laboratories, Incorporated, New York, N.Y., a corporation of New York Filed Sept. 13, 1963, Ser. No. 308,724

2 Claims. (Cl. 29—472.9)

This invention relates to a new method for attaching an electrical wire contact to a quartz crystal.

It has been the practice in the prior art of the fabrication of quartz crystal resonators and filters to attach the contact wire to the quartz crystal by soldering. In this fabrication the usual procedure is to fire a silver paste spot onto the quartz at about 525° C. and then to vapor plate gold or some other metal over the spot and the rest of the crystal surface to form the electrode. The wire is then soldered to the spot, the solder being melted by a hot-air blast. The units produced by this method are usually used at temperatures below 120° C., the temperature at which the normally used solders began to soften. Solders that soften at higher temperatures have higher melting temperatures and the hot-air blast needed to melt these solders twins the quartz. Even if higher melting solder could be used, the fired silver paste, mainly a mixture of finely divided silver particles and low melting glass, softens at about 400° C. and limits the temperature operating range of the crystal device. Fired silver paste is porous and the solvents normally used to clean the crystal devices affect the strength of bonds formed with this paste. Furthermore, the use of silver paste spots requires a complicated and expensive manufacturing process to fire the spots onto the crystal and the raw material cost of the silver and the gold for the electrode is high.

Other troubles associated with solder include wetting deficiencies, flux residues, cold flow and metal whisker growth.

The performance quality of a quartz crystal device is often expressed by the equation:

$$Q=\frac{2\pi fL}{R} \qquad (1)$$

where $f$=frequency in cycles/second, $L$=inductance in henrys, and $R$=resistance in ohms. In the 15° C. to 60° C. normal operating range of quartz crystal filters and resonators, the quality factor (Q) of soldered units falls off rapidly with increasing temperature. Even if there was not this fall-off with temperature, the basically low Q of soldered units makes it difficult to manufacture small crystals, such as 190 kc. extensional mode units, without a problem with rejects due to substandard quality.

The present invention eliminates the soldered joint, the silver paste spots, and the gold electrode layer through the use of an aluminum or titanium layer electrode on the crystal surface and thermocompression bonding of the wire contact to this aluminum or titanium layer.

Thermocompression bonding of one metal to another is a known phenomenon, see Metals Handbook, American Society of Metals, 1948 ed., p. 1105. In the above reference, it was shown that a strong bond could be obtained between a precious metal and a base metal by the application of heat and pressure. The bond forms at temperatures below the melting points of the two substances and at pressures below those necessary for cold welding or percussion welding.

Although thermocompression bonding between metals is known, the present invention discloses how this bonding can be used to make a new and better quartz crystal device. It is obvious that an electrode layer on the quartz crystal of many different conductive metals might easily and quickly thermocompressively bond with a metal contact wire. However, it was found that electrode layers of conductive metals, while forming a good bond with metal wires, did not adhere well to the quartz surface after thermocompression. The bond between the wire and the electrode layer was found to be strong but the attachment separated easily at the quartz-electrode layer interface. This failure is not a function of the adherence of the film to the quartz since some of the films tried, such as platinum, have proven adherence to quartz. It is likely that during thermocompression the normally adhering metal film relaxes its hold on the silicon substrate in favor of alloying with the metal of the wire contact.

At first investigation, the only thermocompression bond which provided adequate strength was where the wire was bonded to a fired silver paste spot overplated by a gold electrode. Although this bond improved the Q value of the units over soldered units, and did eliminate the solder softening temperature limitation and rapid fall-off of Q with temperature found in soldered units, the problems and expense associated with the silver spots were still present.

It has now been found that an aluminum or titanium electrode layer provides a strong bond at the quartz-electrode layer interface, a strong and easily formed thermocompression bond with the wire, and a quartz device with a high and stable Q. Aluminum and titanium have approximately the same high electrical conductivity, which is probably necessary for a high Q, as other commonly used electrode materials, such as gold, silver, or copper; but according to the oxidation potential scale, aluminum and titanium are much more easily oxidized than those commonly used electrode materials. It is conjectured that when the wire is pressed onto the electrode coating of aluminum or titanium at the high temperature and pressure required for thermocompression, the wire metal alloys with the aluminum or titanium at the attachment interface. However, the last few layers of the aluminum or titanium coating, having a chemical bonding with the oxygen in the quartz, do not relax their grip on the quartz substrate. The strength of this bonding arrangement is such that the wire usually breaks before there is any separation at the quartz-electrode coating interface.

The thermocompression bond to aluminum or titanium plating markedly improves the Q of the quartz crystal device. Typical aluminum or titanium plate thermocompression units made according to this invention had a Q two to ten times higher than the soldered units. Not only were the thermocompressed aluminum or titanium layered units found to have a higher Q than soldered units, but units with these metals, in some cases, were found to have twice the Q of units made by thermocompressing to fired silver spots. This performance superiority, in many cases, will eliminate the problem of rejects in the manufacture of small crystal units. The Q of the new units is high enough that the usual manufacturing imperfections will not reduce the Q to a substandard value.

The aluminum or titanium layer thermocompressed bond has the further advantage of being unaffected by the solvents normally used for cleaning crystals thus allowing frequency standard units to be thoroughly cleaned without changing their electrical properties. This new technique has also resulted in new specialized crystal units for high temperature operation, such as a high Q −18° X-cut transducer for evaluating the properties of various glasses over the temperature range from −269° C. to 500° C. Unlike solder and silver paste, the aluminum or titanium does not soften at the upper temperatures in this range.

In view of the large annual demand for crystal units, cost reduction due to the elimination of silver spots would be substantial. The use of the aluminum or titanium electrode in place of the gold electrode also will bring a cost reduction.

Various aspects of the invention may become more clear when considered in conjunction with the drawing, in which.

Figure 1:
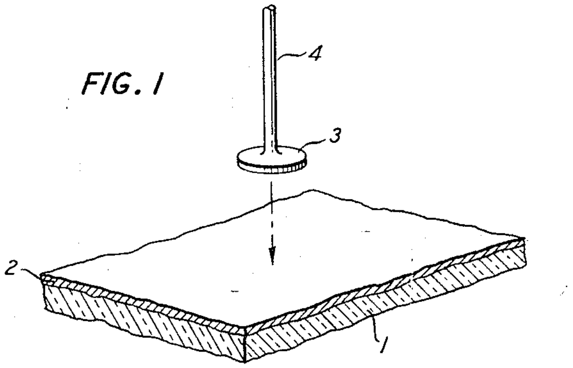
FIG. 1 is a perspective, partially exploded, view of the quartz crystal and the wire contact.

In FIG. 1, a section of the quartz crystal body 1 is shown with a vapor plated layer of aluminum 2 on one surface. It was found that an aluminum or titanium layer vapor plated on a heated quartz substrate in a standard vapor plating apparatus provided strong adherence. Satisfactory results were obtained where the quartz substrate was heated to between 200° C. and 400° C. and where the pressure inside the vapor plating chamber was between $10^{-4}$ torr and $10^{-6}$ torr. Adherence, or attachment, is considered strong, or satisfactory, when most of the pull tests result in a failure of the wire before the failure of any part of the bond. A substrate temperature of at least 275° C. seemed to provide the best adherence. Typical units had estimated aluminum or titanium plate thicknesses from 100 A. to 1000 A., the thickness of the plating depending on how long the vaporizing filaments are incandescent. Good attachments can be made to almost any plate thickness, but a plate thickness of 400 A. to 500 A. was found to give a strong attachment with low resistance.

Other methods of applying the electrode layer can be used. Aluminum or titanium can be sputtered onto the quartz. The layer can also be deposited by vapor decomposition, for example, by passing titanium iodide and hydrogen over the heated substrate.

It was also found that prior to plating, surface treatments of the quartz crystal ranging from an optical polish to a finish with 303½ emery will yield satisfactory attachments. Rougher finishes showed some quartz cracking before wire failure when the wires were pull tested.

The wire contact 4 in FIG. 1 can be made of any conducting metal. It was found that a gold electroplated standard beryllium copper wire provides a good contact. The head 3 in FIG. 1 is easily die formed when this alloy is used. A wire of this copper alloy does not lose its temper in the heat required for the thermocompression attachment to the quartz crystal. The adherence of electroplated gold to the copper alloy was found to be very high. This is evidenced by the fact that no attachments made in the laboratory failed because the gold plating separated from the head of the wire during pull testing of the attachment. Although any gold thickness might be used, gold plate thickness of from 0.2 mil to 1.5 mil was used with satisfactory results. Alternative preferred embodiments are gold wires or wires made of, or plated with, other precious metals.

Depending on the size of the crystal plate 1, mounting wires of three different diameters are commonly used in the manufacture of soldered attachments, namely 5 mil, 6 mil, and 8 mil. Smaller wires are used with smaller crystals because an increase in the area of the attachment interface relative to the size of the crystal causes a decrease in the Q of the unit. The decrease in an already low Q makes it more difficult to manufacture units with up-to-standard performance quality. Because of this invention, the 8 mil size for wire 4 can probably be adopted universally because the Q of the crystal units made according to this invention is so much improved.

In the laboratory units produced, the 8 mil wire was used with 30 mil diameter head 3.

Figure 2:
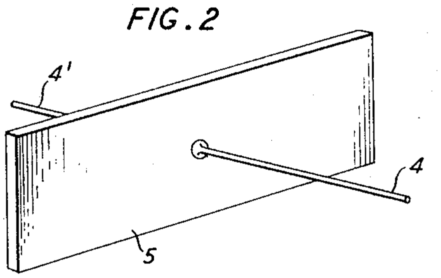
FIG. 2 is a perspective view of the finished crystal device.

FIG. 2 shows an aluminum plated quartz crystal 5 with two gold plated beryllium copper wires 4 and 4'. The wires are mounted in the center of opposite major faces of the plated crystal 5 as is the usual arrangement for quartz crystal filters and resonators. The attachment of the wires according to this invention works well with any cut of the crystal.

Figure 3:
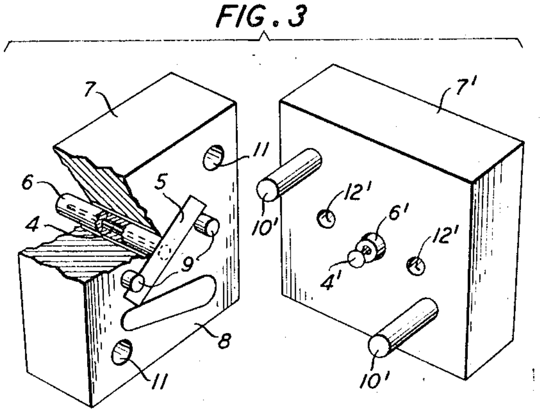
FIG. 3 is a perspective and partially cutaway view of the laboratory thermocompression apparatus.
Figure 4:
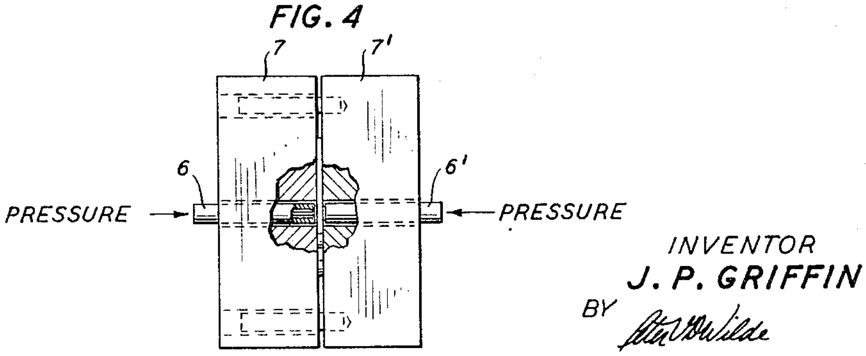
FIG. 4 is a plan and cutaway view of the laboratory apparatus ready for the application of pressure.

The device shown in FIG. 2 can be made by using the thermocompression unit shown in FIGS. 3 and 4. The plated crystal 5 is held at the center of the aluminum block 7 by the spring lever arm 8 and the knobs shown at 9. The headed contact wires 4 and 4' are inserted in capillary tubes 6 and 6' which run through the center of the aluminum block 7 and 7'. When the aluminum blocks 7 and 7' are put together, as shown in FIG. 4, inserts 10' fit into holes 11 and the knobs 9 fit into holes 12'. The blocks 7 and 7' in FIG. 4 are then heated to the desired temperature and the desired pressure is applied to the ends of the capillary tubes 6 and 6'.

Satisfactory attachments were attained with this thermocompressing unit by heating the aluminum blocks 7 and 7' to a temperature in the range of 350° C. to 500° C. and preferably 400° C. to 460° C., the temperature being measured by a thermocouple attached to the blocks, and by applying a pressure to the capillary tubes 6 and 6' such that the wires are pressed against the crystal at a pressure in the range 10,000 p.s.i. to 25,000 p.s.i. and preferably in the range 20,000 p.s.i. to 25,000 p.s.i. The pressure can be applied for one to five seconds. When the pressure indicated above was applied for longer than this period, some quartz cracking developed. Lower pressures for longer time periods may yield satisfactory results, but the short time period allows rapid manufacture of the device. When attachments were made outside the temperature range indicated above, some local twinning of the quartz resulted.

Figure 5:
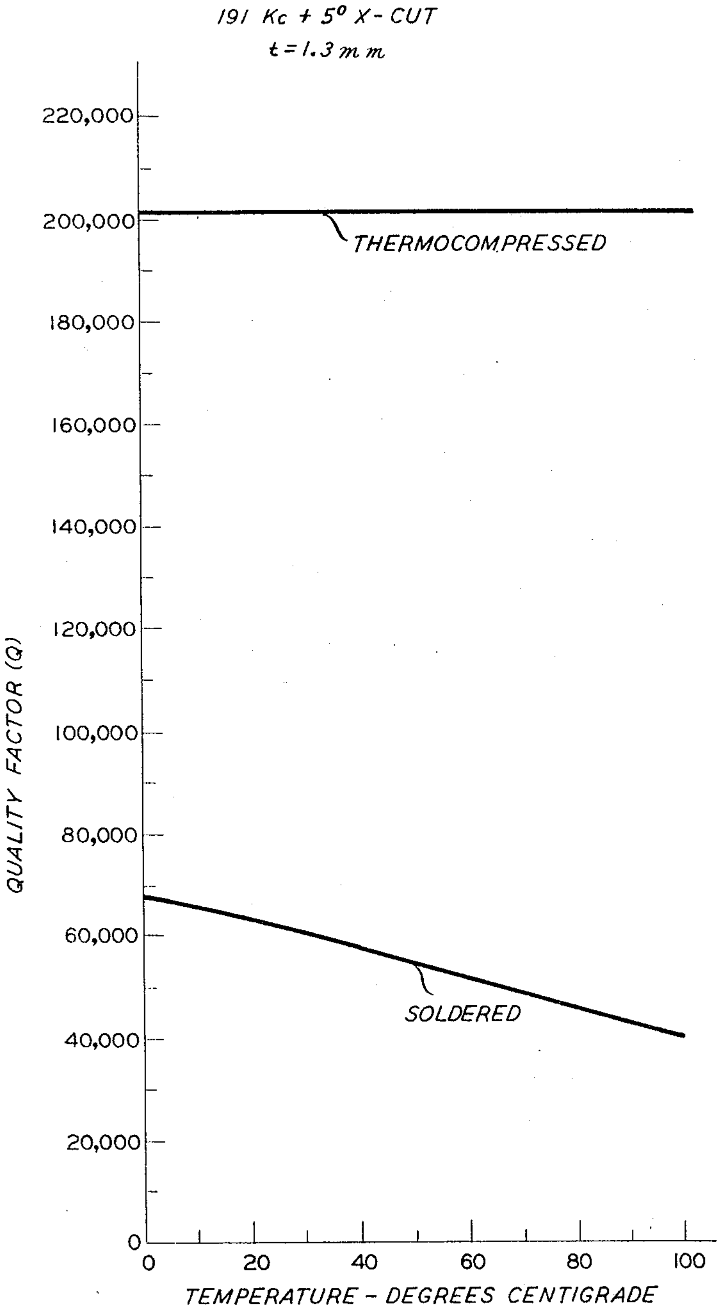
FIG. 5 is a graph comparing the electrical properties of the old soldered and the new thermocompressed units.

FIG. 5 shows the effect of temperature increase on Q for a 1.3 mm. thick, 191 kc., +5° X-cut quartz crystal. The performance of the soldered unit was first measured and then the bond and electrode were removed and the same crystal was treated according to this invention. As shown, the Q at 25° C. of the thermocompressed units is approximately three times higher than the Q at 25° C. of the soldered units. The thermocompressed unit showed no significant decrease in Q between 0° C. and 100° C., while the soldered unit decreased from 69,000 at 0° C. to 40,000 at 100° C.

Various other modifications and extensions of this invention will become apparent to those skilled in the art. All such variations and deviations which basically rely on the teachings, through which this invention has advanced the art, are properly considered within the spirit and scope of this invention.

What is claimed is:

1. A method for making a quartz crystal device which comprises vapor plating on both major surfaces of a quartz crystal wafer, a layer of aluminum 100 A. to 1000 A. thick, said vapor plating being done at a pressure between $10^{-4}$ torr and $10^{-6}$ torr and at a temperature of said quartz crystal surface between 200° C. and 400° C., thermocompressing to each of said aluminum layers on each of said major surfaces at least one gold-plated beryllium copper wire contact by heating the wire end and said layer to a temperature in the range from 350° C. to 500° C. and then pressing the wire end against the aluminum layer at a pressure of between 10,000 p.s.i. and 25,000 p.s.i. for a period of approximately one to five seconds.

2. A method for making a quartz crystal device which comprises vapor plating on both major surfaces of a quartz crystal wafer, a layer of titanium 100 A. to 1000 A. thick, said vapor plating being done at a pressure between $10^{-4}$ torr and $10^{-6}$ torr and at a temperature of said quartz crystal surface between 200° C. and 400° C., thermocompressing to each of said titanium layers on each of said major surfaces at least one gold-plated beryllium copper wire contact by heating the wire end and said layer to a temperature in the range from 350° C to 500° C. and then pressing the wire end against the titanium layer at a pressure of between 10,000 p.s.i. and 25,000 p.s.i. for a period of approximately one to five seconds.

References Cited by the Examiner

UNITED STATES PATENTS

| | | | |
|---|---|---|---|
| 2,669,660 | 2/1954 | Mason et al. | 310—8 |
| 2,812,270 | 11/1957 | Alexander | 117—107 |
| 3,006,067 | 10/1961 | Anderson et al. | 29—498 |
| 3,037,180 | 5/1962 | Linz | 29—155.71 |
| 3,071,491 | 1/1963 | Horn et al. | 117—107 |
| 3,217,401 | 11/1965 | White | 29—155.5 |

OTHER REFERENCES

Metals Handbook, vol. 1, published by American Society for Metals, 1961, page 1037.

Metals Handbook, vol. 2, published by American Society for Metals, 1961, pages 516–525.

JOHN F. CAMPBELL, *Primary Examiner.*

L. J. WESTFALL, *Assistant Examiner.*